United States Patent
Yamazaki et al.

(10) Patent No.: US 8,748,223 B2
(45) Date of Patent: Jun. 10, 2014

(54) METHOD FOR MANUFACTURING OXIDE SEMICONDUCTOR FILM AND METHOD FOR MANUFACTURING SEMICONDUCTOR DEVICE

(75) Inventors: Shunpei Yamazaki, Setagaya (JP); Junichiro Sakata, Atsugi (JP); Akiharu Miyanaga, Hadano (JP); Masayuki Sakakura, Tochigi (JP); Junichi Koezuka, Atsugi (JP); Tetsunori Maruyama, Atsugi (JP); Yuki Imoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 107 days.

(21) Appl. No.: 12/888,846

(22) Filed: Sep. 23, 2010

(65) Prior Publication Data

US 2011/0070693 A1    Mar. 24, 2011

(30) Foreign Application Priority Data

Sep. 24, 2009  (JP) ................................. 2009-219210

(51) Int. Cl.
*H01L 21/00* (2006.01)
*H01L 21/16* (2006.01)

(52) U.S. Cl.
USPC ..................................... 438/104; 257/E21.46

(58) Field of Classification Search
USPC ..................................... 438/104; 257/E21.46
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| EP | 1737044 A | 12/2006 |
| EP | 1976018   | 10/2008 |

(Continued)

OTHER PUBLICATIONS

International Search Report (Application No. PCT/JP2010/065350) Dated Dec. 7, 2010.

(Continued)

*Primary Examiner* — Jarrett Stark
(74) *Attorney, Agent, or Firm* — Eric J. Robinson; Robinson Intellectual Property Law Office, P.C.

(57) ABSTRACT

An object is to provide an oxide semiconductor having stable electric characteristics and a semiconductor device including the oxide semiconductor. A manufacturing method of a semiconductor film by a sputtering method includes the steps of holding a substrate in a treatment chamber which is kept in a reduced-pressure state; heating the substrate at lower than 400° C.; introducing a sputtering gas from which hydrogen and moisture are removed in the state where remaining moisture in the treatment chamber is removed; and forming an oxide semiconductor film over the substrate with use of a metal oxide which is provided in the treatment chamber as a target. When the oxide semiconductor film is formed, remaining moisture in a reaction atmosphere is removed; thus, the concentration of hydrogen and the concentration of hydride in the oxide semiconductor film can be reduced. Thus, the oxide semiconductor film can be stabilized.

14 Claims, 5 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,141,821 B1* | 11/2006 | Yamazaki et al. | 257/69 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0076835 A1* | 4/2004 | Watanabe | 428/432 |
| 2004/0077134 A1* | 4/2004 | Takayama et al. | 438/151 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0138399 A1* | 6/2006 | Itano et al. | 257/40 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1* | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0237598 A1 | 10/2008 | Nakayama | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140438 A1* | 6/2009 | Yamazaki et al. | 257/776 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0051940 A1 | 3/2010 | Yamazaki et al. | |
| 2010/0051949 A1* | 3/2010 | Yamazaki et al. | 257/57 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| EP | 2226847 A | 9/2010 |
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-331619 | 12/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-194594 | 8/2007 |
| JP | 2008-121034 | 5/2008 |
| JP | 2009-212497 | 9/2009 |
| WO | WO-2004/114391 | 12/2004 |

OTHER PUBLICATIONS

Written Opinion (Application No. PCT/JP2010/065350) Dated Dec. 7, 2010.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$=3, 4, and 5), $InGaO_3(ZnO)_3$, and $Ga_2O_3(ZnO)_m$ ($m$=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura, et al., "Syntheses and Crystal Structures of New Homologous Compounds, Indium Iron Zinc Oxides ($InFeO_3(ZnO)_m$) ($m$: natural number) and Related Compounds," Kotai Butsuri (Solid State Physics), 1993, vol. 28, No. 5, pp. 317-327.

(56) References Cited

OTHER PUBLICATIONS

Nomura et al., "Thin-Film Transistor Fabricated in Single-Crystalline Transparent Oxide Semiconductor,", Science, May 23, 2003, vol. 300, No. 5623, pp. 1269-1272.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1 Invited Paper: Improved Amorphous In-Ga-Zn-O TFTs,", SID Digest '08 : SID International Symposium Digest of Technical Papers, May 20, 2008, vol. 39, pp. 621-624.

Masuda.S et al. "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel Using Amorphous In-Ga-Zn-Oxide TFT,", SID Digest '09 : SID International Symposium Digest of Technical Papers, May 31, 2009, pp. 184-187.

Nomura.K et al., "Carrier transpor in transparent oxide semiconductor with intrinsic structural randomness probed using single-crystalline InGaO3(ZnO)5 films,", Apple. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08. : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J at al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

METHOD FOR MANUFACTURING OXIDE SEMICONDUCTOR FILM AND METHOD FOR MANUFACTURING SEMICONDUCTOR DEVICE

TECHNICAL FIELD

One embodiment of the present invention relates to methods for manufacturing an oxide semiconductor film and a semiconductor device using an oxide semiconductor.

BACKGROUND ART

A thin film transistor (a TFT) including a semiconductor thin film (having a thickness of several nanometers to several hundreds nanometers) which is formed over a substrate having an insulating surface is applied to a thin film integrated circuit, a liquid crystal display device, or the like. In particular, application of a thin film transistor as a switching element provided in a pixel of a liquid crystal display device is expanding.

In a conventional technique, a thin film transistor is manufactured using a silicon semiconductor. However, in recent years, a technique for manufacturing a thin film transistor using a metal oxide having semiconductor characteristics has attracted attention. Indium oxide is a well-known material as a metal oxide, and has been used as a transparent electrode material which is necessary for a liquid crystal display device because it has high conductivity.

On the other hand, it is known that a metal oxide shows semiconductor characteristics by control of the composition of the metal oxide; typically, tungsten oxide, tin oxide, indium oxide, zinc oxide, or the like can be given as a metal oxide having semiconductor characteristics. Thin film transistors in which a channel formation region is formed using such a metal oxide having semiconductor characteristics (i.e., an oxide semiconductor) are already known (Patent Documents 1 to 4, Non-Patent Document 1).

As metal oxides, multi-component oxides as well as single-component oxides are known. For example, $InGaO_3(ZnO)_m$ (m is a natural number) having a homologous series is known as a multi-component oxide semiconductor including In, Ga, and Zn (Non-Patent Documents 2 to 4). In addition, it has been confirmed that an oxide semiconductor including such an In—Ga—Zn-based oxide can be used as a channel layer of a thin film transistor (Patent Document 5, Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", Appl. Phys. Lett., 17 Jun., 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$, (m=7, 8, 9, and 16) in the $In_2O_3$—$ZnGa_2O_4$—ZnO System", J. Solid State Chem., 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", KOTAI BUTSURI (SOLID STATE PHYSICS), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492

DISCLOSURE OF INVENTION

However, because the composition of an oxide semiconductor cannot be easily controlled, a difference from a stoichiometric composition of the oxide semiconductor occurs in a process of forming an oxide semiconductor film. For example, electrical conductivity of an oxide semiconductor is changed due to excess and deficiency of oxygen. Incorporation of hydrogen and moisture in a process of forming the oxide semiconductor film form an O—H (oxygen-hydrogen) bond and serve as an electron donor in the oxide semiconductor film, which results in change in electrical conductivity. Since an OH group is a polar molecule, it causes change in characteristics of a thin film transistor manufactured using an oxide semiconductor film which includes a large number of OH groups.

In view of the above problems, an object of one embodiment of the present invention is to provide an oxide semiconductor film having stable electric characteristics and a semiconductor device using the oxide semiconductor film.

One embodiment of the present invention is a method for manufacturing a semiconductor film by a sputtering method, including the steps of holding a substrate in a treatment chamber which is kept in a reduced-pressure state; setting the temperature of the substrate to lower than 400° C.; introducing a sputtering gas from which hydrogen and moisture are removed into the treatment chamber in the state where remaining moisture in the treatment chamber is removed; and forming an oxide semiconductor film over the substrate with use of a metal oxide as a target.

When the oxide semiconductor film is formed, an entrapment vacuum pump is preferably used for evacuating the treatment chamber. For example, a cryopump, an ion pump, or a titanium sublimation pump is preferably used. The vacuum pump such as a turbo molecular pump which evacuates gas by rotating a turbine blade at high speed has characteristics in that the pumping speed with respect to a light gas such as hydrogen is decreased. Therefore, it is not suitable to use a turbo molecular pump for sufficiently evacuating remaining hydrogen and moisture from the treatment chamber of a sputtering apparatus for manufacture of a highly purified oxide semiconductor film. On the other hand, since an entrapment vacuum pump sufficiently evacuates even a light gas such as hydrogen, it is possible to reduce the concentration of hydrogen in the oxide semiconductor film to $5 \times 10^{19}/cm^3$ or less by removal of remaining hydrogen and moisture in the treatment chamber of the sputtering apparatus.

When the oxide semiconductor film is formed, a metal oxide containing zinc oxide as its main component can be used as the target. Alternatively, a metal oxide containing indium, gallium, and zinc can be used as the target.

One embodiment of the present invention is a method for manufacturing an oxide semiconductor film and a method for manufacturing a semiconductor device which includes the step of forming a protective film for stabilizing characteristics of an element manufactured using the oxide semiconductor film. In one embodiment of this manufacturing method, a substrate over which a gate electrode and a gate insulating film covering the gate electrode are formed is introduced into a first treatment chamber; the temperature of the substrate is set to lower than 400° C.; a sputtering gas from which hydrogen and moisture are removed is introduced in the state where remaining moisture in the first treatment chamber is removed; and an oxide semiconductor film is formed over the substrate with use of a metal oxide which is provided in the first treatment chamber and contains at least zinc oxide as a target.

Then, a source electrode and a drain electrode are formed over the oxide semiconductor film; the substrate is introduced into a second treatment chamber; the temperature of the substrate is set to lower than 100° C.; a sputtering gas including oxygen from which hydrogen and moisture are removed is introduced in the state where remaining moisture in the second treatment chamber is removed; and a silicon oxide film including a defect is formed over the substrate with use of a silicon semiconductor target which is provided in the second treatment chamber.

Then, the substrate over which the silicon oxide film is formed is introduced into a third treatment chamber; the substrate is heated at 200° C. to 400° C. to diffuse hydrogen or moisture included in the oxide semiconductor film into the silicon oxide film including the defect; and a silicon nitride film is formed over the silicon oxide film.

In the method for manufacturing a semiconductor device, when the oxide semiconductor film and/or the silicon oxide film are/is formed, an entrapment vacuum pump is preferably used for evacuating the first treatment chamber and/or the second treatment chamber. For example, a cryopump, an ion pump, or a titanium sublimation pump is preferably used. The above entrapment vacuum pump functions so as to reduce hydrogen, a hydroxyl group, or hydride included in the oxide semiconductor film and/or the silicon oxide film.

In the method for manufacturing a semiconductor device, a metal oxide containing zinc oxide as its main component can be used as the target for forming the oxide semiconductor film. Alternatively, a metal oxide containing indium, gallium, and zinc can be used as the target.

In the method for manufacturing a semiconductor device, as the target for forming the silicon oxide film, a silicon semiconductor target or a synthetic quartz target can be used.

Note that the ordinal number such as "first", "second", or "third" used to disclose or specify the present invention is given for convenience to distinguish elements, and not given to limit the number, the arrangement, and the order of the steps as long as there is no particular limitation. When a component is mentioned as being "over" or "under" another component in order to disclose or specify the present invention, the two components are in direct contact with each other in some cases; however, another component may be present between the two components in other cases. In terms used to disclose or specify the present invention, a singular can also mean a plural unless the meaning of the singular is clearly different from the meaning of the plural in the context. The word "include" or "have" is used to express the presence of a characteristic, a number, a step, operation, a component, a piece, or combination thereof, and do not eliminate the possibility of presence or addition of one or more other characteristics, numbers, steps, operation, components, pieces, or combination thereof. In the terms used to disclose or specify the present invention, all the terms which are used including the technical or scientific terms have the same meaning as ones which can be generally understood by those who have conventional knowledge in the technical field to which the present invention belongs. The terms same as ones defined in a commonly-used dictionary should be interpreted as including the meaning in accordance with the meaning in the context of the related art, and should not be interpreted as being ideally or excessively literally unless they are defined clearly in this specification.

When the oxide semiconductor film is formed, remaining moisture in a reaction atmosphere is removed; thus, the concentration of hydrogen and the concentration of hydride in the oxide semiconductor film can be reduced. Thus, the oxide semiconductor film can be stabilized.

When the oxide semiconductor film serving as a channel formation region is formed over the gate insulating film, remaining moisture in a reaction atmosphere is removed; thus, the concentration of hydrogen and the concentration of hydride in the oxide semiconductor film can be reduced. By provision of the silicon oxide film including a defect in contact with the oxide semiconductor film, hydrogen and moisture in the oxide semiconductor film can be diffused into the silicon oxide film, so that the concentration of hydrogen and the concentration of hydride in the oxide semiconductor film can be reduced.

In addition, the silicon nitride film is formed over the silicon oxide film including a defect in the state where the substrate is heated; thus, hydrogen and moisture can be diffused from the oxide semiconductor film into the silicon oxide film and a barrier film for prevention of entry of moisture from an outer atmosphere can be provided.

BEST MODE FOR CARRYING OUT THE INVENTION

Figure 1:
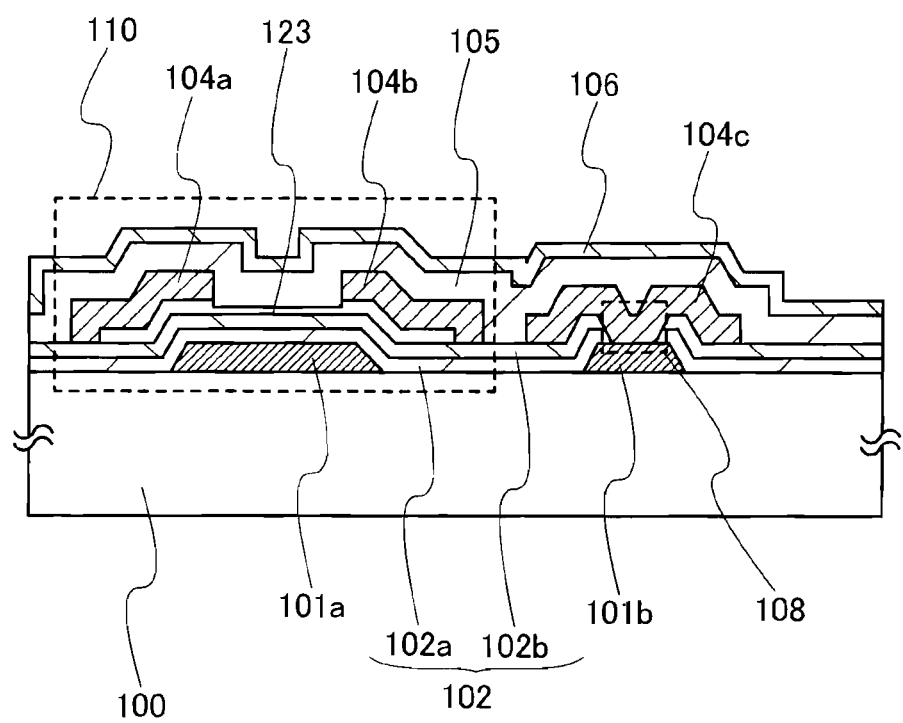
FIG. 1 is a cross-sectional view illustrating a structure of a semiconductor device according to one embodiment.

An embodiment of the disclosed invention will be described. Note that the disclosed invention is not limited to the description below, and it is easily understood by those skilled in the art that a variety of changes and modifications can be made without departing from the spirit and scope of the disclosed invention. Therefore, the disclosed invention should not be interpreted as being limited to the following description of the embodiment.

In the embodiment described below, the same reference numerals may be used to denote the same components among different drawings. Note that elements in the drawings, that is, the thickness and width of layers, regions, the relative positional relationships between the components, and the like may be exaggerated for the sake of clarity of the description in the embodiment.

FIG. 1 illustrates a structure of a semiconductor device. In a thin film transistor 110 of the semiconductor device, a gate electrode 101a and a first wiring 101b formed from the same layer as the gate electrode 101a are provided over a substrate 100. A gate insulating layer 102 is formed over the gate electrode 101a and the first wiring 101b. The gate insulating layer 102 is preferably formed using an oxide insulating material.

FIG. 1 illustrates the case where the gate insulating layer 102 is formed of a first gate insulating layer 102a and a second gate insulating layer 102b. In this case, the second gate insulating layer 102b in contact with an oxide semiconductor layer 123 is preferably formed using an oxide insulating material. The oxide semiconductor layer 123 is formed over the gate electrode 101a with the gate insulating layer 102 therebetween.

A source electrode 104a and a drain electrode 104b are formed so that end portions of the source electrode 104a and the drain electrode 104b overlap with the gate electrode 101a. An oxide insulating film 105 is provided over the source electrode 104a and the drain electrode 104b. Between the source electrode 104a and the drain electrode 104b, the oxide insulating film 105 is in contact the oxide semiconductor layer 123. A protective insulating film 106 is provided over the oxide insulating film 105.

A contact hole 108 is formed in the gate insulating layer 102 to reach the first wiring 101b. The first wiring 101b and a second wiring 104c are connected to each other through the contact hole 108.

One example of a method for manufacturing a semiconductor device which includes the thin film transistor 110 will be described with reference to FIGS. 2A to 2D.

Figure 2A:
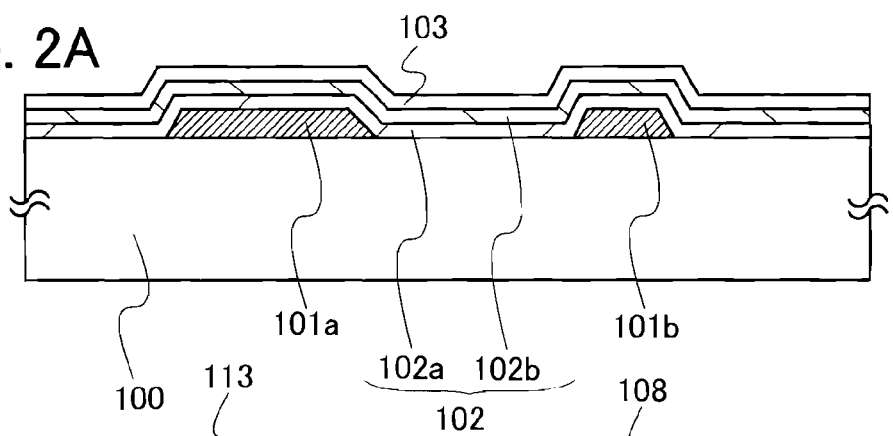
FIGS. 2A to 2D are cross-sectional views illustrating a method for manufacturing a semiconductor device according to one embodiment.

FIG. 2A shows the stage at which the gate electrode 101a, the first wiring 101b, the gate insulating layer 102, and an oxide semiconductor film 103 are formed over the substrate 100.

As a glass substrate used for the substrate 100, it is possible to use a glass substrate used for a liquid crystal panel. For example, a glass material such as aluminosilicate glass, aluminoborosilicate glass, or barium borosilicate glass can be used. More practical glass with heat resistance can be obtained by containing a larger amount of barium oxide (BaO) than the amount of boron oxide ($B_2O_3$). Therefore, a glass substrate containing a larger amount of BaO than the amount of $B_2O_3$ is preferably used.

After formation of a conductive film over the substrate 100 having an insulating surface, a first wiring layer including the gate electrode 101a and the first wiring 101b is formed through a first photolithography step. End portions of the gate electrode 101a are preferably tapered. A resist mask may be formed by an inkjet method. Formation of the resist mask by an inkjet method needs no photomask; thus, manufacturing cost can be reduced.

As the conductive film for forming the gate electrode 101a and the first wiring 101b, an element selected from Al, Cr, Ta, Ti, Mo, or W, an alloy containing any of these elements as a component, an alloy containing any of these elements in combination, or the like can be used. The conductive film can be a single layer or a stack formed using silicon, a metal material such as copper, neodymium, or scandium, or an alloy material containing any of these materials as a main component, in addition to the above metal. For example, the gate electrode 101a and the first wiring 101b can be formed to have a stacked-layer structure in which an Al film is sandwiched between Ti films.

The gate electrode can also be formed using a light-transmitting conductive film instead of a non-light-transmitting metal film. As a light-transmitting conductive film, a transparent conductive oxide or the like can be given.

Next, the gate insulating layer 102 and the oxide semiconductor film 103 are formed. The gate insulating layer 102 can be formed by a plasma CVD method or a sputtering method. The gate insulating layer 102 is formed using an oxide insulating film such as silicon oxide or aluminum oxide. A silicon oxide film and an aluminum oxide film can be formed by a sputtering method. For example, in the case where a silicon oxide film is formed by a sputtering method, a silicon target or a quartz target is used as a target, and oxygen or a mixed gas of oxygen and argon is used as a sputtering gas. Since the amount of hydrogen in a silicon oxide film or an aluminum oxide film formed by a sputtering method is small, the silicon oxide film or the silicon aluminum film formed by a sputtering method is preferably used as the gate insulating layer 102 in contact with the oxide semiconductor film 103. When a large amount of hydrogen is contained in the gate insulating layer 102, hydrogen is diffused into the oxide semiconductor film 103, which causes change in characteristics of the transistor.

Note that the gate insulating layer 102 can be formed to have a structure in which a silicon nitride layer and a silicon oxide layer are stacked from the gate electrode 101a side. For example, a silicon nitride layer ($SiN_y(y>0)$) is formed as the first gate insulating layer 102a by a sputtering method, and a silicon oxide layer ($SiO_x(x>0)$) is stacked as the second gate insulating layer 102b over the first gate insulating layer 102a; in such a manner, the gate insulating layer 102 having a thickness of 100 nm is formed as illustrated in FIG. 2A.

It is preferable that hydrogen, a hydroxyl group, and moisture be contained in the gate insulating layer 102 as little as possible; therefore, the substrate 100 over which the gate electrode 101a and the first wiring 101b are formed is preferably heated at 200° C. or higher in a preheating chamber of a sputtering apparatus as pretreatment for deposition, so that impurities attached to the substrate 100 can be removed.

Then, the oxide semiconductor film 103 is formed over the gate insulating layer 102. The oxide semiconductor film 103 is formed by a sputtering method. The oxide semiconductor film 103 is formed using, for example, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. Further, the oxide semiconductor film 103 can be formed by a sputtering method under a rare gas (typically argon) atmosphere, an oxygen atmosphere, or an atmosphere containing a rare gas (typically argon) and oxygen. When a sputtering method is employed, deposition may be performed using a target containing silicon oxide at greater than or equal to 2 wt % and less than or equal to 10 wt % so that silicon oxide is contained in the film. Since silicon oxide prevents crystallization of the oxide semiconductor film, the oxide semiconductor film containing silicon oxide can be prevented from being crystallized during heat treatment for dehydration or dehydrogenation in a later step.

As a target for forming the oxide semiconductor film 103 by a sputtering method, a metal oxide target containing zinc oxide as its main component can be used. As another example of a metal oxide target, an oxide semiconductor target containing In, Ga, and Zn (in a composition ratio, $In_2O_3:Ga_2O_3:ZnO=1:1:1$ [mol %], In:Ga:Zn=1:1:0.5 [atomic %]) can be used. The fill rate of the oxide semiconductor target is greater than or equal to 90% and less than or equal to 100%, preferably, greater than or equal to 95% and less than or equal to 99.9%. With the use of the oxide semiconductor target with high fill rate, a dense oxide semiconductor film is formed.

In the case where the oxide semiconductor film 103 is formed by a sputtering method, first, the substrate is held in a treatment chamber which is kept in a reduced-pressure state, and the substrate is heated at lower than 400° C. Then, a sputtering gas from which hydrogen and moisture are removed is introduced into the treatment chamber from which remaining moisture is being removed, and an oxide semiconductor film is deposited over the substrate with use of a metal oxide as a target. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, a hydrogen atom, a compound containing a hydrogen atom such as $H_2O$, a compound containing a carbon atom, and the like are removed, whereby the concentration of impurities in the oxide semiconductor film formed in the deposition chamber can be reduced.

There is no particular limitation on the deposition condition of the oxide semiconductor film, and it is set as appropriate. As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct-current (DC) power source is preferably used because dust can be reduced and the film thickness can be uniform. The thickness of the oxide semiconductor film 103 is preferably greater than or equal to 5 nm and less than or equal to 50 nm Needless to say, the thickness of the oxide semiconductor film is not limited to the above range, and is set as appropriate in consideration of characteristics of the transistor.

By formation of the oxide semiconductor film by a sputtering method as described above, an oxide semiconductor film whose quantitative result of the concentration of hydrogen measured by secondary ion mass spectrometry (SIMS) is reduced to $2\times10^{19}$ $cm^{-3}$ or less, preferably $5\times10^{18}$ $cm^{-3}$ or less can be obtained.

Figure 5:
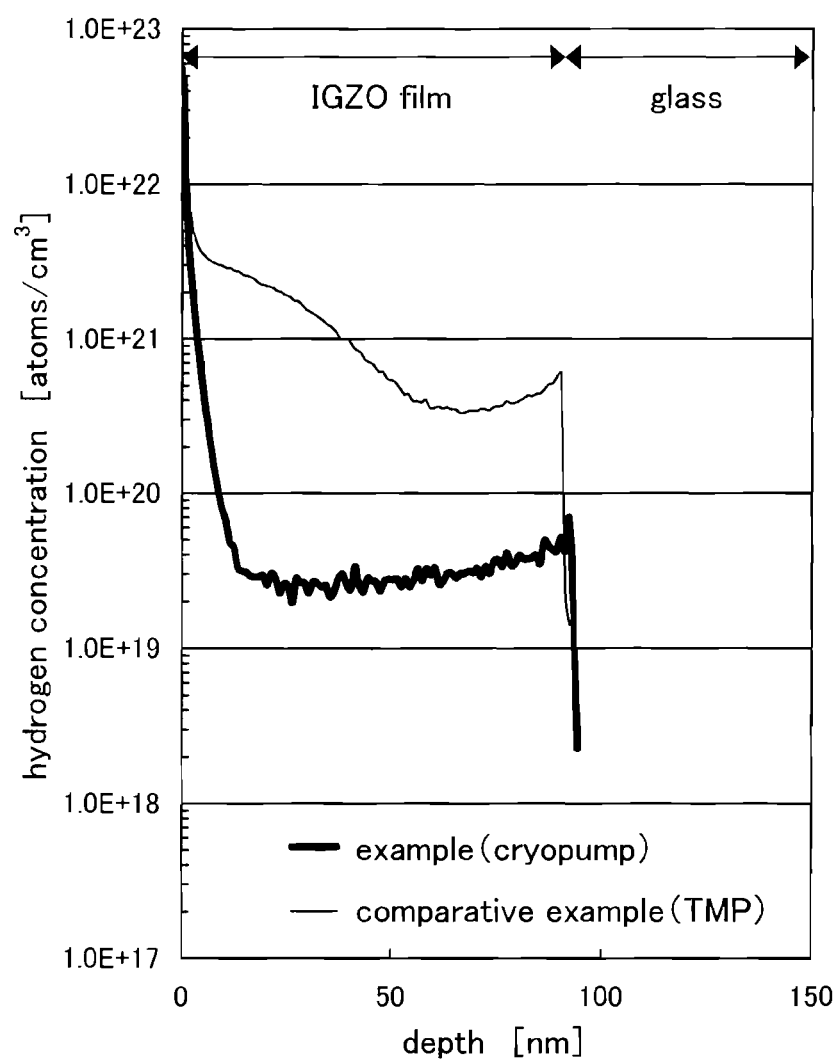
FIG. 5 is a graph showing results of measuring the concentration of hydrogen in oxide semiconductor films manufactured during evacuation with a cryopump by a secondary ion mass spectrometry method.

Here, the concentration of hydrogen in the oxide semiconductor film is described. FIG. 5 shows results of measuring, by a secondary ion mass spectrometry method, the concentration of hydrogen in oxide semiconductor films formed by a sputtering method.

In FIG. 5, an oxide semiconductor film formed during evacuation with a cryopump is shown as an Example. This oxide semiconductor film is formed under the following condition: a metal oxide target (manufactured by Kojundo Chemical Lab. Co., Ltd, the relative density: 80%) having a ratio of In:Ga:Zn=1:1:0.5 is used as a target; argon and oxygen are used ($Ar/O_2$=30/15 sccm) as a sputtering gas; the T/S distance is 60 mm; the DC electric power is 0.5 kW; and the deposition pressure is 0.4 Pa.

In FIG. 5, an oxide semiconductor film formed during evacuation with a turbo molecular pump using a target which has the same composition and is formed by the same manufacturer as the above example is shown as a comparative example. This oxide semiconductor film is formed under the following condition: argon and oxygen ($Ar/O_2$=10/5 sccm) are used as a sputtering gas; the T/S distance is 170 mm; the DC electric power is 0.5 kW; and the deposition pressure is 0.4 Pa.

As apparent from FIG. 5, the concentration of hydrogen in the film of a sample of the example (i.e., the oxide semiconductor film formed during evacuation with a cryopump) is reduced to $5\times10^{19}/cm^3$ or less, whereas the concentration of hydrogen in the film of a sample of the comparative example is $1\times10^{20}/cm^3$ or more. It is apparent from FIG. 5 that the concentration of hydrogen in the oxide semiconductor film can be more reduced in the case where deposition by a sputtering method is performed with an entrapment vacuum pump such as a cryopump removing moisture.

Figure 2B:
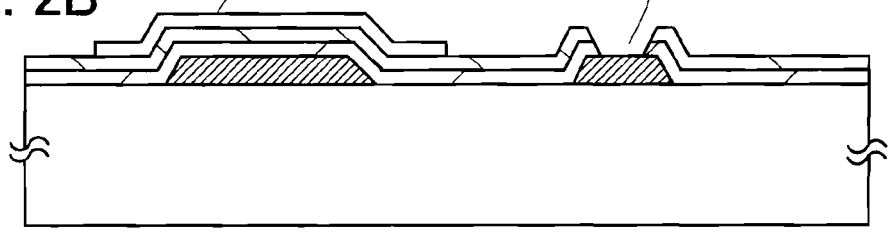

FIG. 2B shows the stage at which the oxide semiconductor film 103 is processed into an island shape by a second photolithography step to form an oxide semiconductor layer 113, and the contact hole 108 is formed by a third photolithography step. A resist mask for forming the semiconductor layer 113 may be formed by an inkjet method; in that case, the manufacturing cost can be reduced because a photomask is not used.

The contact hole 108 is provided in the gate insulating layer 102 to expose the first wiring 101b.

Figure 2C:
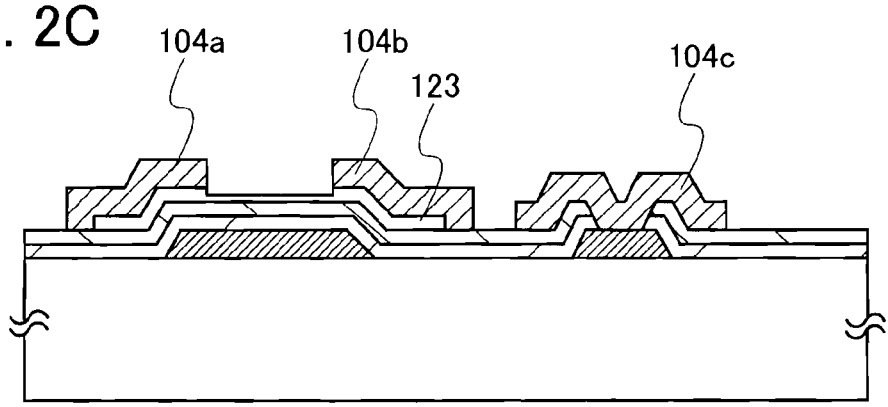

FIG. 2C shows the stage at which a conductive film to be the source electrode, the drain electrode, and the like of the thin film transistor is formed. As the conductive film, a metal selected from Ti, Mo, W, Al, Cr, Cu, or Ta, an alloy containing any of the above elements as a component, an alloy containing any of these elements in combination, or the like can be used. The conductive film is not limited to a single layer containing the above-described element and may be a stack of two or more layers. For example, a three-layer conductive film in which a titanium film (with a thickness of 100 nm), an aluminum film (with a thickness of 200 nm), and a titanium film (with a thickness of 100 nm) are stacked is formed. Instead of a titanium film, a titanium nitride film may be used.

Next, a fourth photolithography step is performed. A resist mask is formed, and the conductive film is selectively etched, so that the source electrode 104a, the drain electrode 104b, and the second wiring 104c are formed. In FIG. 2C, the second wiring 104c is in contact with the first wiring 101b through the contact hole 108 which is formed in the first gate insulating layer 102a and the second gate insulating layer 102b.

In the fourth photolithography step, only portions of the conductive film which are in contact with the oxide semiconductor layer 113 are selectively removed. In the case of using an ammonia peroxide mixture (at a composition weight ratio of hydrogen peroxide:ammonia:water=5:2:2) or the like as an alkaline etchant in order to selectively remove only portions of the conductive film which are in contact with the oxide semiconductor layer 113, the metal conductive film can be selectively removed, so that the oxide semiconductor layer 123 containing an In—Ga—Zn—O-based oxide semiconductor can remain. A resist mask for forming the source electrode 104a, the drain electrode 104b, and the second wiring 104c may be formed by an inkjet method. Formation of the resist mask by an inkjet method needs no photomask; thus, manufacturing cost can be reduced.

Figure 2D:
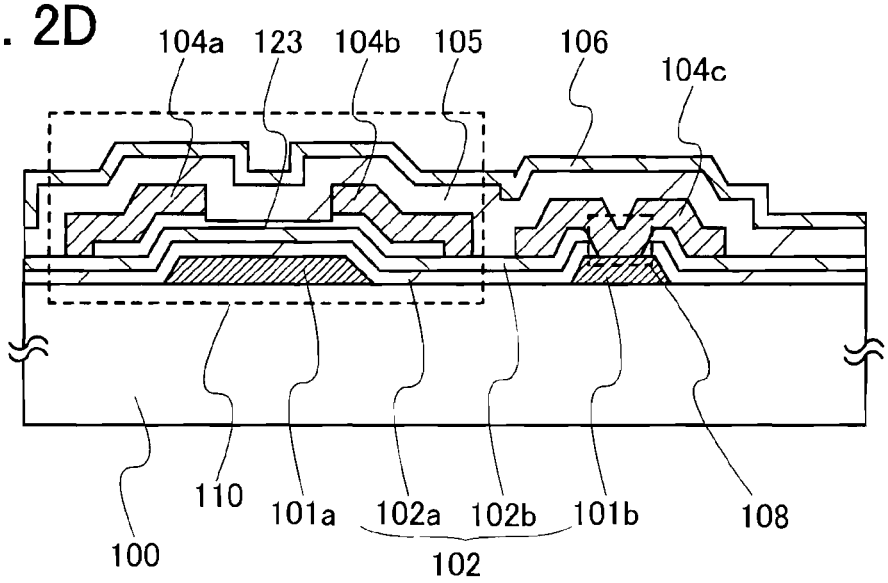

FIG. 2D shows the stage at which the oxide insulating film 105 and the protective insulating film 106 are formed over the oxide semiconductor layer 123 over which the source electrode 104a, the drain electrode 104b, and the second wiring 104c are formed.

In a region where the oxide semiconductor layer 123 overlaps with neither the source electrode 104a nor the drain electrode 104b, the oxide semiconductor layer 123 and the oxide insulating film 105 are in contact with each other. A region of the oxide semiconductor layer 123 which is between the source electrode 104a and the drain electrode 104b, overlaps with the gate electrode, and is provided between the oxide insulating film 105 and the gate insulating layer 102 and in contact with the oxide insulating film 105 and the gate insulating layer 102 serves as a channel formation region.

The oxide insulating film 105 is preferably formed by a sputtering method. This is because hydrogen is not to be contained in the oxide insulating film 105 like the above gate insulating layer. Therefore, the oxide insulating film 105 is also preferably formed by the sputtering method in the state where remaining hydrogen, a remaining hydroxyl group, or remaining moisture in the treatment chamber is removed. As a material for forming the oxide insulating film 105, silicon oxide or aluminum oxide can be used.

There is no particular limitation on the deposition condition of the oxide insulating film, and it is set as appropriate. For example, a silicon oxide film is formed by a pulse DC sputtering method under the following condition: a boron-doped silicon target (having a resistance of 0.01 Ωcm) is used; the distance between the substrate and the target (the T-S distance) is 89 mm; the pressure is 0.4 Pa; the direct-current (DC) power source is 6 kW; and the atmosphere is an oxygen atmosphere (the proportion of the oxygen flow rate is 100%). By formation of the silicon oxide film by a sputtering method, a defect (due to a structural defect, i.e., a dangling bond) can be included in the silicon oxide film. This is because a sputtering method is a physical deposition method in which atoms or particles sputtered from a target are made to be attached to a substrate, and the atoms or particles attached to the substrate are rapidly cooled, so that a thin film including a structural defect is easily formed. Note that instead of a silicon target, quartz (preferably, synthetic quartz) can be used as the target for forming the silicon oxide film.

Next, the protective insulating film 106 is formed over the oxide insulating film 105. As the protective insulating film 106, a silicon nitride film, a silicon nitride oxide film, an aluminum nitride film, or the like can be used. Here, as the protective insulating film 106, a silicon nitride film is formed. The silicon nitride film can be formed by a sputtering method.

When the protective insulating film 106 is formed, the substrate 100 is heated at 200° C. to 400° C.; thus, hydrogen or moisture included in the oxide semiconductor film can be diffused into the oxide insulating film (the silicon oxide film including a defect). Since the oxide insulating film 105 contains many defects (dangling bonds), an impurity such as hydrogen, a hydroxyl group, or moisture contained in the oxide semiconductor layer 123 are diffused into the oxide insulating film 105 through the interface between the oxide semiconductor layer 123 and the oxide insulating film 105. Specifically, a hydrogen atom, a compound containing a hydrogen atom such as $H_2O$, or a compound containing a carbon atom in the oxide semiconductor layer 123 is easily diffused into the oxide insulating film 105.

When the oxide semiconductor film is formed in the above manner, remaining moisture in a reaction atmosphere is removed; thus, the concentration of hydrogen and that of hydride in the oxide semiconductor film can be reduced. Therefore, characteristics of the transistor can be stabilized.

When the oxide semiconductor film serving as the channel formation region is formed over the gate insulating film, remaining moisture in a reaction atmosphere is removed; thus, the concentration of hydrogen and that of hydride in the oxide semiconductor film can be reduced. By provision of the silicon oxide film including a defect in contact with the oxide semiconductor film, hydrogen and moisture in the oxide semiconductor film can be diffused into the silicon oxide film, so that the concentration of hydrogen and that of hydride in the oxide semiconductor film can be reduced.

In addition, the silicon nitride film is formed over the silicon oxide film including a defect in the state where the substrate is heated; thus, hydrogen and moisture can be diffused from the oxide semiconductor film into the silicon oxide film and a barrier film for prevention of entry of moisture from an outer atmosphere can be provided.

The above steps can be used for manufacture of a liquid crystal display panel, an electroluminescence display panel, and a backplane (a substrate over which a thin film transistor is formed) of a display device using electronic ink. The above steps are performed at 400° C. or lower; therefore, the above steps can be applied to a manufacturing process in which a glass substrate having a thickness of 1 mm or less and having a side that is longer than 1 m is used. All the above steps can be performed at 400° C. or lower; thus, a large amount of energy is not needed for manufacturing a display panel.

Figure 3:
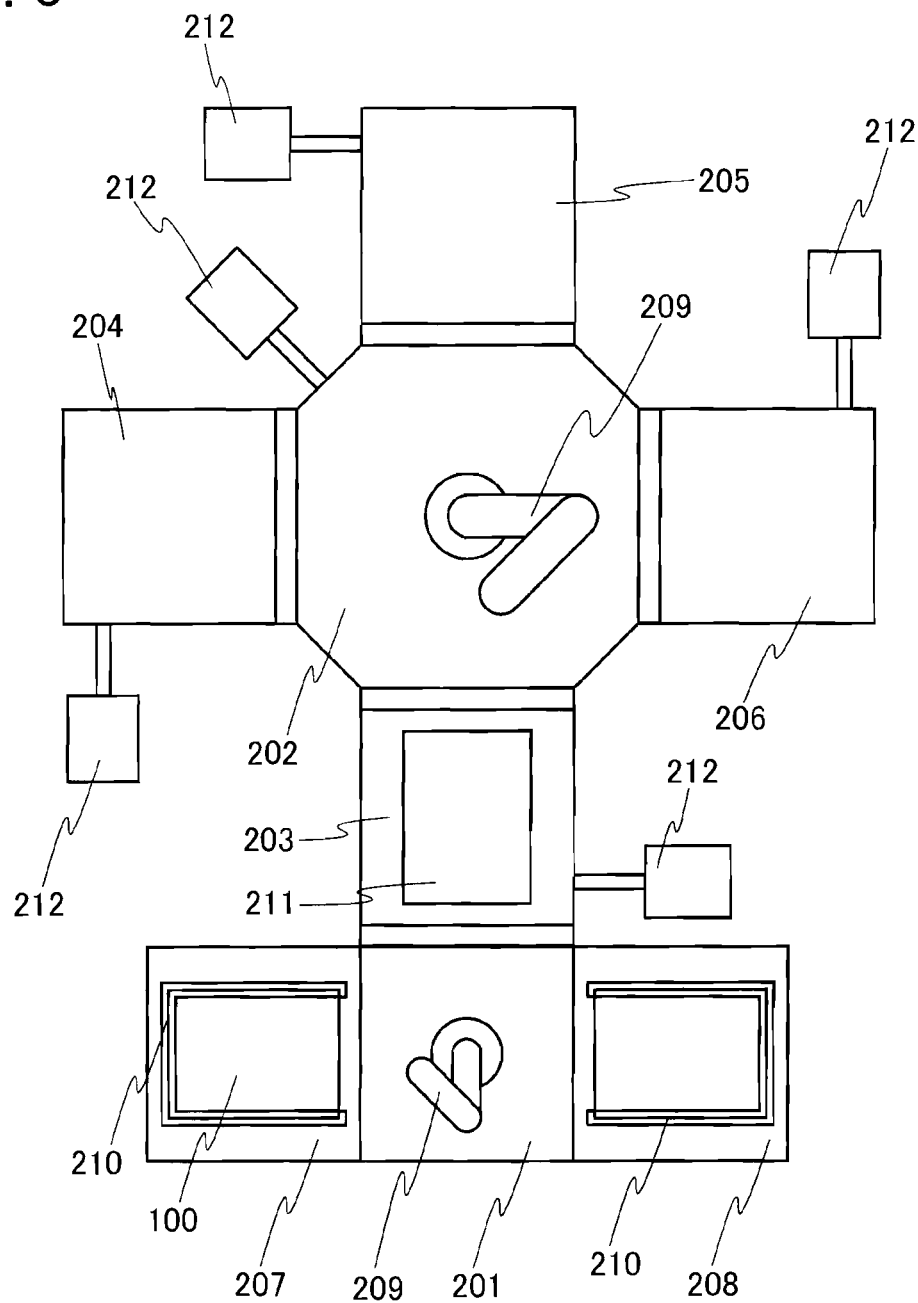
FIG. 3 illustrates one example of a deposition apparatus.

FIG. 3 illustrates an example of a deposition apparatus that can be used for manufacturing an oxide semiconductor film and a semiconductor device in which an oxide semiconductor film is used.

The deposition apparatus illustrated in FIG. 3 is provided with a load chamber 207 and an unload chamber 208. In each of the load chamber 207 and the unload chamber 208, a cassette 210 which stores a substrate before treatment or a substrate after treatment is provided. A first transfer chamber 201 is provided between the load chamber 207 and the unload chamber 208, and is provided with a transfer unit 209 which transfers a substrate.

The deposition apparatus is provided with a second transfer chamber 202. The second transfer chamber 202 is provided with the transfer unit 209. Four treatment chambers (a first treatment chamber 203, a second treatment chamber 204, a third treatment chamber 205, and a fourth treatment chamber 206) are connected to the second transfer chamber 202 through gate valves, and are arranged around the second transfer chamber 202. Note that one side of the first treatment chamber 203 is connected to the first transfer chamber 201 through a gate valve, and the other side of the first treatment chamber 203 is connected to the second transfer chamber 202 through a gate valve.

The second transfer chamber 202, the first treatment chamber 203, the second treatment chamber 204, the third treatment chamber 205, and the fourth treatment chamber 206 are each provided with an evacuation unit 212. Although the evacuation unit may be selected depending on the use application of each treatment chamber, an entrapment evacuation unit such as a cryopump is particularly preferable. Alternatively, as the evacuation unit, a turbo pump provided with a cold trap may be used. Such an evacuation unit has an effect of attaching remaining moisture in a treatment chamber to a cooled metal surface; therefore, it is effective to use such an evacuation unit for improvement in purity of an oxide semiconductor film.

In the case where the oxide semiconductor film is formed, an evacuation unit such as a cryopump is preferably used in order to prevent incorporation of remaining moisture as an impurity in the treatment chambers (needless to say, including the treatment chamber for forming the oxide semiconductor film) in steps before and after formation of films in contact with the oxide semiconductor film and steps before and after formation of the oxide semiconductor film.

A substrate-heating unit 211 is provided in the first treatment chamber 203. The first treatment chamber 203 serves as a delivery chamber for transferring a substrate from the first transfer chamber 201 in an atmospheric-pressure state to the second transfer chamber 202 in a reduced-pressure state. By provision of the delivery chamber, the second transfer chamber 202 can be prevented from being contaminated by air.

The second treatment chamber 204, the third treatment chamber 205, and the fourth treatment chamber 206 are provided with a structure for forming a silicon nitride film by a sputtering method, a structure for forming a silicon oxide film by a sputtering method, and a structure for forming an oxide semiconductor film by a sputtering method, respectively. That is, a target and a substrate-heating unit are provided in each of the treatment chambers, and the treatment chambers are each provided with a gas supply unit for introducing a sputtering gas and a glow discharge generation unit.

Next, an example of operation of the deposition apparatus is described. Here, a method for successively forming the gate insulating film and the oxide semiconductor film over the substrate over which the gate electrode 101a and the first wiring 101b are formed as illustrated in FIG. 2A is described.

The transfer unit 209 transfers the substrate 100 over which the gate electrode 101a and the first wiring 101b are formed to the first treatment chamber 203 from the cassette 210. Next, the substrate 100 is preheated in the first treatment chamber 203 with the gate valve closed, whereby impurities attached to the substrate are eliminated and evacuated. Examples of the impurities are a hydrogen atom, a compound containing a hydrogen atom such as $H_2O$, a compound containing a carbon atom, and the like.

The substrate 100 is transferred to the second treatment chamber 204, and a silicon nitride film is formed. Then, the substrate 100 is transferred to the third treatment chamber 205, and a silicon oxide film is formed. In such a manner, the gate insulating layer 102 is formed. The second treatment chamber 204 and the third treatment chamber 205 are preferably evacuated by a cryopump or the like so that the concentration of impurities in the treatment chambers can be reduced. The silicon nitride film and the silicon oxide film stacked in the treatment chambers in which the concentration of impurities is reduced are used as the gate insulating layer 102 in which hydrogen, a hydroxyl group, moisture, or the like is reduced.

The substrate 100 is transferred to the third treatment chamber 205. A target for an oxide semiconductor is provided in the third treatment chamber 205, and the third treatment chamber 205 is provided with a cryopump as an evacuation unit. In the third treatment chamber 205, an oxide semiconductor layer is formed. In the third treatment chamber 205, remaining moisture is removed by the cryopump, so that the concentration of hydrogen in the oxide semiconductor film 103 can be reduced. The oxide semiconductor film 103 is formed in the state where the substrate is heated. Deposition by a sputtering method is performed in the state where remaining moisture in the treatment chamber is removed by the cryopump, whereby the substrate temperature at the time of forming the oxide semiconductor film 103 can be 400° C. or lower.

In the above-described manner, the gate insulating layer 102 and the oxide semiconductor film 103 can be successively formed by the deposition apparatus. The structure in which three or more treatment chambers are connected through a transfer chamber is employed in FIG. 3; however, another structure may be employed. For example, a so-called in-line structure in which the entrance and the exit for the substrate are provided and the treatment chambers are connected to each other may be employed.

Figure 4:
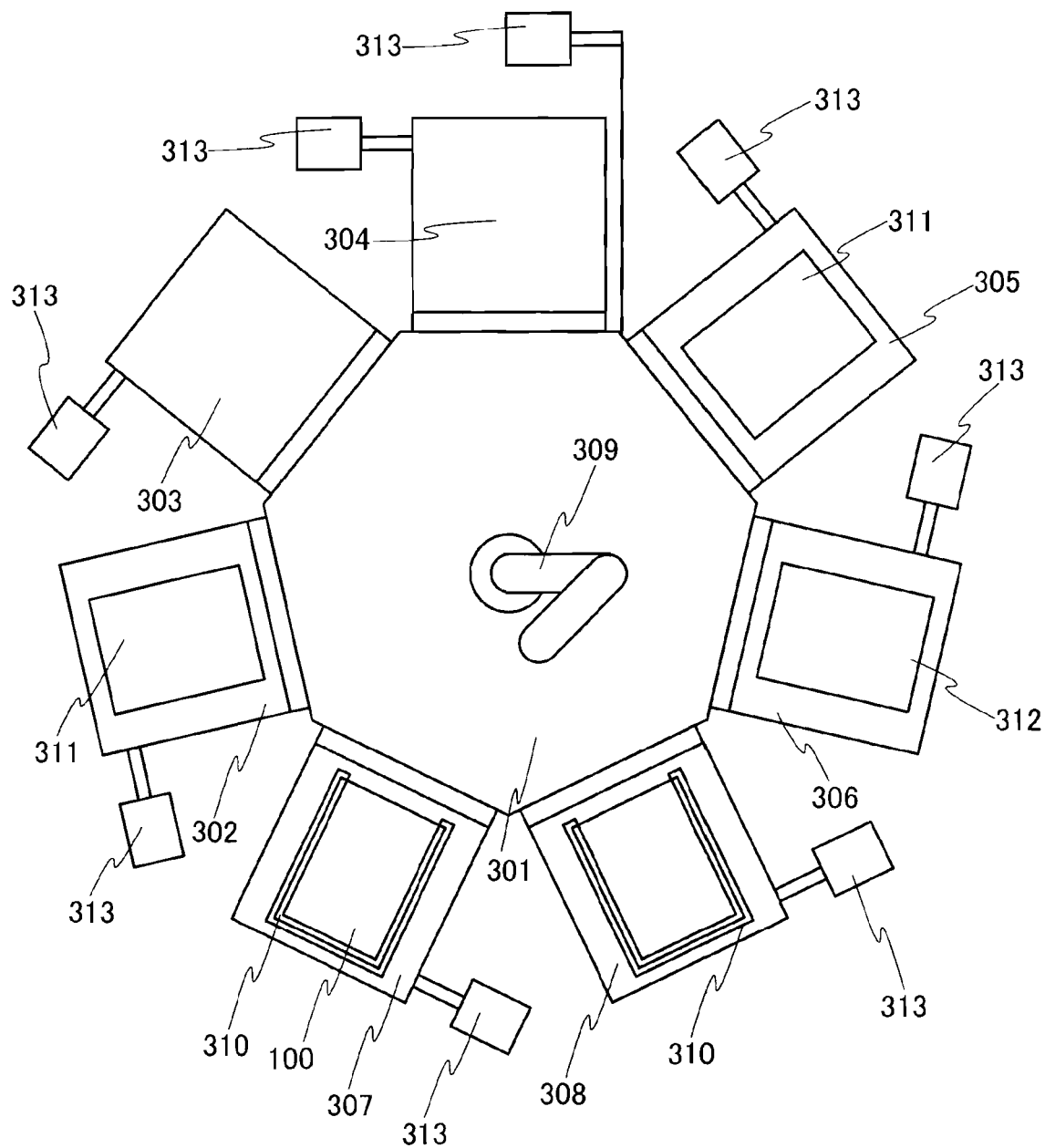
FIG. 4 illustrates one example of a deposition apparatus.

FIG. 4 shows an example of a deposition apparatus for forming the oxide insulating film 105 and the protective insulating film 106 over the oxide semiconductor layer 123 as illustrated in FIG. 2D.

This deposition apparatus is provided with a load chamber 307 and an unload chamber 308. The load chamber 307 and the unload chamber 308 are each provided with a cassette 310 which stores a substrate before treatment or a substrate after treatment.

In addition, this deposition apparatus is provided with a transfer chamber 301. The transfer chamber 301 is provided with a transfer unit 309. Five treatment chambers (a first treatment chamber 302, a second treatment chamber 303, a third treatment chamber 304, a fourth treatment chamber 305, and a fifth treatment chamber 306) are connected to the transfer chamber 301 through gate valves, and are arranged around the transfer chamber 301.

The load chamber 307, the unload chamber 308, the transfer chamber 301, the first treatment chamber 302, the second treatment chamber 303, the third treatment chamber 304, the fourth treatment chamber 305, and the fifth treatment chamber 306 are each provided with an evacuation unit 313, so that the chambers can be in a reduced-pressure state. Although the evacuation unit may be selected in accordance with the use application of each treatment chamber, an evacuation unit such as a cryopump is particularly preferable. Alternatively, as the evacuation unit, a turbo pump provided with a cold trap may be used.

The load chamber 307 and the unload chamber 308 each serve as a delivery chamber for transferring a substrate to the transfer chamber 301. By provision of the delivery chamber, the transfer chamber 301 can be prevented from being contaminated by air.

The first treatment chamber 302 and the fourth treatment chamber 305 are each provided with a substrate-heating unit 311. The second treatment chamber 303 and the third treatment chamber 304 are provided with a structure for forming a silicon oxide film by a sputtering method and a structure for forming a silicon nitride film by a sputtering method, respectively. That is, a target and a substrate-heating unit are provided in each of the treatment chambers, and the treatment chambers are each provided with a gas supply unit for introducing a sputtering gas and a glow discharge generation unit. In addition, a cooling unit 312 is provided in the fifth treatment chamber 306.

An example of operation of the deposition apparatus is described. A method for forming the oxide insulating film 105 and the protective insulating film 106 over the oxide semiconductor layer 123 as illustrated in FIG. 2D is described.

First, the load chamber 307 is evacuated so that the load chamber 307 is made to have substantially the same pressure as the transfer chamber 301, and then, the substrate 100 is transferred from the load chamber 307 to the first treatment chamber 302 through the transfer chamber 301 with the gate valve opened.

It is preferable that the substrate 100 be preheated by the substrate-heating unit 311 in the first treatment chamber 302 so that impurities attached to the substrate can be eliminated and evacuated. Examples of the impurities are a hydrogen atom, a compound containing a hydrogen atom such as $H_2O$, a compound containing a carbon atom, and the like. Note that the temperature of the preheating is higher than or equal to 100° C. and lower than or equal to 400° C., preferably higher than or equal to 150° C. and lower than or equal to 300° C. As an evacuation unit provided for the first treatment chamber 302, a cryopump is preferably used. Since impurities attached to the substrate 100 are eliminated by the preheating and are diffused into the first treatment chamber 302, the impurities should be evacuated from the first treatment chamber 302 with use of a cryopump. Note that this preheating treatment can be omitted.

The substrate 100 is transferred to the second treatment chamber 303, and the oxide insulating film 105 is formed. For example, a silicon oxide film is formed as the oxide insulating film 105. The second treatment chamber 303 is evacuated by a cryopump or the like, so that the concentration of impurities in the treatment chamber is reduced. The concentration of impurities in the oxide insulating film formed in the treatment chamber with reduced impurities is suppressed. Specifically, the concentration of hydrogen contained in the oxide insulating film can be reduced. Although the oxide insulating film 105 may be formed in the state where the substrate 100 is heated, the oxide insulating film 105 is preferably formed at room temperature to about 200° C. so that the oxide insulating film 105 includes a defect.

In the case where a silicon oxide film is formed as the oxide insulating film 105 by a sputtering method, a quartz target or a silicon target can be used as a target. The silicon oxide film formed by a sputtering method under an atmosphere including oxygen and a rare gas with use of a quartz target or a silicon target can include a dangling bond of a silicon atom or an oxygen atom.

By provision of the oxide insulating film 105 including a large number of dangling bonds in contact with the oxide semiconductor layer 123, impurities such as hydrogen, a hydroxyl group, and moisture in the oxide semiconductor layer 123 are easily diffused into the oxide insulating film 105 through the interface between the oxide semiconductor layer 123 and the oxide insulating film 105. Specifically, a hydrogen atom or a compound containing a hydrogen atom such as $H_2O$ in the oxide semiconductor layer 123 is easily diffused into the oxide insulating film 105. As a result, the concentration of impurities in the oxide semiconductor layer 123 is reduced.

Next, the substrate 100 is transferred to the third treatment chamber 304, and the protective insulating film 106 is formed over the oxide insulating film 105. As the protective insulating film 106, a film having a function of preventing diffusion of impurity elements is used; for example, a silicon nitride film, a silicon nitride oxide film, or the like can be used. The third treatment chamber 304 is preferably evacuated by a cryopump or the like so that the concentration of impurities in the treatment chamber can be reduced.

The protective insulating film 106 prevents diffusion and entry of impurities from an outer atmosphere of the thin film transistor 110. Examples of the impurities are hydrogen, a compound containing a hydrogen atom such as $H_2O$, a compound containing a carbon atom, and the like.

In the case where a silicon nitride film is formed as the protective insulating film 106 by a sputtering method, for example, the protective insulating film 106 is formed in the following manner: a silicon target is used; a mixed gas of nitrogen and argon is introduced into the third treatment chamber 304; and reactive sputtering is performed. The substrate temperature is set to higher than or equal to 200° C. and lower than or equal to 400° C., for example, higher than or equal to 200° C. and lower than or equal to 350° C. Through the deposition at high temperature, impurities including a hydrogen atom such as hydrogen, a hydroxyl group, and moisture can be diffused into the oxide insulating film 105 and the concentration of impurities in the oxide semiconductor layer 123 can be reduced. In particular, the substrate temperature is preferably higher than or equal to 200° C. and lower than or equal to 350° C. so that diffusion of hydrogen atoms can be promoted.

Note that the heat treatment may be performed after the protective insulating film 106 is formed in order to diffuse impurities including a hydrogen atom such as hydrogen, a hydroxyl group, and moisture into the oxide insulating film 105 and to reduce the concentration of impurities in the oxide semiconductor layer 123.

For example, as illustrated in FIG. 4, the substrate 100 is transferred to the fourth treatment chamber 305, and heat treatment after deposition is performed. The substrate temperature of the heat treatment after deposition is higher than or equal to 200° C. and lower than or equal to 400° C. Through the heat treatment, impurities included in the oxide semiconductor layer can be easily diffused into the oxide insulating film 105 through the interface between the oxide semiconductor layer 123 and the oxide insulating film 105. Specifically, a hydrogen atom or a compound containing a hydrogen atom such as $H_2O$ in the oxide semiconductor layer 123 is easily diffused into the oxide insulating film. As a result, the concentration of impurities in the oxide semiconductor layer 123 is reduced.

After the heat treatment, the substrate 100 is transferred to the fifth treatment chamber 306. The substrate 100 is cooled to such low temperature that reincorporation of impurities such as water is suppressed from the substrate temperature T of the heat treatment after the deposition. Specifically, the substrate 100 is slowly cooled to the temperature lower than the substrate temperature T by 100° C. or more. Cooling may be performed with helium, neon, argon, or the like introduced into the fifth treatment chamber 306. Note that it is preferable that water, hydrogen, or the like be not included in nitrogen or a rare gas such as helium, neon, or argon which is used for the cooling. The purity of nitrogen or a rare gas such as helium, neon, or argon is preferably 6N (99.9999%) or more, more preferably 7N (99.99999%) or more (that is, the concentration of impurities is 1 ppm or less, preferably 0.1 ppm or less).

With use of a deposition apparatus to which an evacuation unit such as a cryopump is applied, impurities in a treatment chamber can be reduced. Impurities attached to the inner wall of the treatment chamber are eliminated, and incorporation of impurities into a substrate during deposition and a film can be reduced. In addition, impurities which are eliminated from an atmosphere during preheating are evacuated, whereby the impurities can be prevented from being attached to the substrate again.

The oxide insulating film 105 formed in the above manner includes a large number of dangling bonds. By provision of the oxide insulating film 105 in contact with the oxide semiconductor layer 123, impurities such as a hydrogen atom and a compound containing a hydrogen atom such as $H_2O$ in the oxide semiconductor layer 123 can be diffused into or moved to the oxide insulating film 105 from the oxide semiconductor layer 123. As a result, the concentration of impurities in the oxide semiconductor layer 123 can be reduced.

For example, in a thin film transistor in which an oxide semiconductor layer serving as a channel formation region is in contact with an oxide insulating film formed using a deposition apparatus described in this embodiment, the carrier concentration of the channel formation region is reduced in the state where voltage is not applied to a gate electrode, i.e., in the off state; therefore, the thin film transistor has low off current and has favorable characteristics.

A structure in which three or more treatment chambers are connected through a transfer chamber is employed in FIG. 4; however, a structure of an apparatus for reducing hydrogen and moisture in an oxide semiconductor film is not limited thereto. For example, a so-called in-line structure in which the entrance and the exit for the substrate are provided and the treatment chambers are connected to each other may be employed.

The above steps using the deposition apparatus can be used for manufacture of a liquid crystal display panel, an electroluminescence display panel, and a backplane (a substrate over which a thin film transistor is formed) of a display device using electronic ink. The above steps using the deposition apparatus are performed at 400° C. or lower; therefore, the above steps using the deposition apparatus can be applied to a manufacturing process in which a glass substrate having a thickness of 1 mm or less and having a side that is longer than 1 m is used. All the above steps can be performed at 400° C. or lower; thus, a large amount of energy is not needed for manufacturing a display panel.

This application is based on Japanese Patent Application serial no. 2009-219210 filed with Japan Patent Office on Sep. 24, 2009, the entire contents of which are hereby incorporated by reference.

EXPLANATION OF REFERENCE

100: substrate, 101a: gate electrode, 101b: first wiring, 102: gate insulating layer, 102a: first gate insulating layer, 102b: second gate insulating layer, 103: oxide semiconductor film, 104a: source electrode, 104b: drain electrode, 104c: second wiring, 105: oxide insulating film, 106: protective insulating film, 108: contact hole, 110: thin film transistor, 113: oxide semiconductor layer, 123: oxide semiconductor layer, 201: first transfer chamber, 202: second transfer chamber, 203: first treatment chamber, 204: second treatment chamber, 205: third treatment chamber, 206: fourth treatment chamber, 207: load chamber, 208: unload chamber, 209: transfer unit, 210: cassette, 211: substrate-heating unit, 212: evacuation unit, 301: transfer chamber, 302: first treatment chamber, 303: second treatment chamber, 304: third treatment chamber, 305: fourth treatment chamber, 306: fifth treatment chamber, 307: load chamber, 308: unload chamber, 309: transfer unit, 310: cassette, 311: substrate-heating unit, 312: cooling unit, and 313: evacuation unit

The invention claimed is:

1. A method for manufacturing a semiconductor device, comprising the steps of:
    forming a gate electrode over a substrate;
    forming a gate insulating film over the gate electrode;
    forming an oxide semiconductor film over the gate insulating film by a sputtering method using an oxide semiconductor target in a chamber;
    forming a source electrode and a drain electrode over the oxide semiconductor film;
    forming a silicon oxide film over the source electrode and the drain electrode while the substrate is heated at 200° C. to 400° C.; and
    forming a silicon nitride film over the silicon oxide film while the substrate is heated at 200° C. to 400° C.,
    wherein a filling rate of the oxide semiconductor target is greater than or equal to 90%,
    wherein the chamber is evacuated with use of a cryopump, and
    wherein, when the oxide semiconductor film is formed, a sputtering gas from which hydrogen and moisture are removed is introduced into the chamber.

2. The method for manufacturing a semiconductor device according to claim 1, wherein the oxide semiconductor film comprises zinc.

3. The method for manufacturing a semiconductor device according to claim 1, wherein the oxide semiconductor film comprises indium, gallium, and zinc.

4. A method for manufacturing a semiconductor device comprising the steps of:
    forming a gate electrode over a substrate;
    forming a gate insulating film over the gate electrode;
    forming an oxide semiconductor film over the gate insulating film by a sputtering method using an oxide semiconductor target in a chamber;
    forming a source electrode and a drain electrode over the oxide semiconductor film;
    forming a silicon oxide film over the source electrode and the drain electrode while the substrate is heated at 200° C. to 400° C.; and
    forming a silicon nitride film over the silicon oxide film while the substrate is heated at 200° C. to 400° C.,
    wherein a filling rate of the oxide semiconductor target is greater than or equal to 90%,
    wherein the chamber is evacuated with use of a turbo molecular pump with a cold trap, and
    wherein, when the oxide semiconductor film is formed, a sputtering gas from which hydrogen and moisture are removed is introduced into the chamber.

5. A method for manufacturing a semiconductor device comprising the steps of:
    forming a gate electrode over a substrate;
    forming a gate insulating film over the gate electrode;
    forming an oxide semiconductor film over the gate insulating film by a sputtering method using an oxide semiconductor target in a chamber;
    forming a source electrode and a drain electrode over the oxide semiconductor film;
    forming a silicon oxide film over the source electrode and the drain electrode while the substrate is heated at 200° C. to 400° C.; and
    forming a silicon nitride film over the silicon oxide film while the substrate is heated at 200° C. to 400° C.,
    wherein a filling rate of the oxide semiconductor target is greater than or equal to 90%,
    wherein the chamber is evacuated with use of an entrapment vacuum pump, and
    wherein, when the oxide semiconductor film is formed, a sputtering gas from which hydrogen and moisture are removed is introduced into the chamber.

6. The method for manufacturing a semiconductor device according to claim 5, wherein the entrapment vacuum pump is a cryopump.

7. The method for manufacturing a semiconductor device according to claim 5, wherein the entrapment vacuum pump is a turbo molecular pump with a cold trap.

8. The method for manufacturing a semiconductor device according to claim 1, wherein a concentration of hydrogen in the oxide semiconductor film is lower than or equal to $5 \times 10^{19}/\text{cm}^3$.

9. The method for manufacturing a semiconductor device according to claim 4, wherein a concentration of hydrogen in the oxide semiconductor film is lower than or equal to $5\times10^{19}/cm^3$.

10. The method for manufacturing a semiconductor device according to claim 5, wherein a concentration of hydrogen in the oxide semiconductor film is lower than or equal to $5\times10^{19}/cm^3$.

11. The method for manufacturing a semiconductor device according to claim 4, wherein the oxide semiconductor film comprises zinc.

12. The method for manufacturing a semiconductor device according to claim 4, wherein the oxide semiconductor film comprises indium, gallium, and zinc.

13. The method for manufacturing a semiconductor device according to claim 5, wherein the oxide semiconductor film comprises zinc.

14. The method for manufacturing a semiconductor device according to claim 5, wherein the oxide semiconductor film comprises indium, gallium, and zinc.

* * * * *

UNITED STATES PATENT AND TRADEMARK OFFICE
CERTIFICATE OF CORRECTION

PATENT NO. : 8,748,223 B2
APPLICATION NO. : 12/888846
DATED : June 10, 2014
INVENTOR(S) : Shunpei Yamazaki et al.

It is certified that error appears in the above-identified patent and that said Letters Patent is hereby corrected as shown below:

IN THE SPECIFICATION:

At column 1, lines 66-67, "G Muller," should be --G. Muller,--;

At column 2, line 11, "$Ga_2O_3(ZnO)_m$," should be --$Ga_2O_3(ZnO)_m$--;

At column 7, line 50, "nm" should be --nm.--.

Signed and Sealed this
Thirteenth Day of January, 2015

Michelle K. Lee
*Deputy Director of the United States Patent and Trademark Office*